(12) United States Patent
Shih et al.

(10) Patent No.: US 10,566,229 B2
(45) Date of Patent: Feb. 18, 2020

(54) MICROELECTRONIC PACKAGE STRUCTURES INCLUDING REDISTRIBUTION LAYERS

(71) Applicant: Micron Technology, Inc., Boise, ID (US)

(72) Inventors: Shing-Yih Shih, New Taipei (TW); Hsu Chiang, New Taipei (TW); Neng-Tai Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/910,360

(22) Filed: Mar. 2, 2018

(65) Prior Publication Data
US 2018/0190531 A1 Jul. 5, 2018

Related U.S. Application Data

(62) Division of application No. 14/731,380, filed on Jun. 4, 2015, now Pat. No. 9,916,999.

(51) Int. Cl.
*H01L 21/683* (2006.01)
*H01L 21/48* (2006.01)
(Continued)

(52) U.S. Cl.
CPC ...... *H01L 21/6835* (2013.01); *H01L 21/4857* (2013.01); *H01L 21/6836* (2013.01);
(Continued)

(58) Field of Classification Search
CPC ........... H01L 24/81; H01L 2924/15311; H01L 2221/68359; H01L 2224/81192;
(Continued)

(56) References Cited

U.S. PATENT DOCUMENTS 8,508,024 B2 8/2013 Chang
9,006,030 B1* 4/2015 Kwon .................. H01L 23/562
438/108
(Continued)

FOREIGN PATENT DOCUMENTS

CN 104051411 A 9/2014
CN 104051422 A 9/2014
(Continued)

OTHER PUBLICATIONS

Chinese Office Action and Search Report for Chinese Application No. 201510607208.4, dated Apr. 3, 2018, 18 pages with English translation.
(Continued)

*Primary Examiner* — Thanh Y. Tran
(74) *Attorney, Agent, or Firm* — TraskBritt

(57) ABSTRACT

A package structure and a method for fabricating thereof are provided. The package structure includes a substrate, a first connector, a redistribution layer, a second connector, and a chip. The first connector is disposed over the substrate. The redistribution layer is directly disposed over the first connector, and is connected to the substrate by the first connector. The redistribution layer includes a block layer, and a metal layer over the block layer. The second connector is directly disposed over the redistribution layer, and the chip is connected to the redistribution layer by the second connector.

15 Claims, 10 Drawing Sheets

(51) Int. Cl.
*H01L 23/538* (2006.01)
*H01L 23/00* (2006.01)
*H01L 23/498* (2006.01)
*H01L 25/065* (2006.01)
*H01L 25/18* (2006.01)
*H01L 25/00* (2006.01)
*H01L 21/78* (2006.01)

(52) U.S. Cl.
CPC .......... *H01L 23/5383* (2013.01); *H01L 24/92* (2013.01); *H01L 24/97* (2013.01); *H01L 21/78* (2013.01); *H01L 23/49816* (2013.01); *H01L 23/5385* (2013.01); *H01L 24/11* (2013.01); *H01L 24/13* (2013.01); *H01L 24/16* (2013.01); *H01L 24/17* (2013.01); *H01L 24/81* (2013.01); *H01L 25/0655* (2013.01); *H01L 25/18* (2013.01); *H01L 25/50* (2013.01); *H01L 2221/68331* (2013.01); *H01L 2221/68345* (2013.01); *H01L 2221/68359* (2013.01); *H01L 2221/68381* (2013.01); *H01L 2224/1132* (2013.01); *H01L 2224/11312* (2013.01); *H01L 2224/11462* (2013.01); *H01L 2224/11464* (2013.01); *H01L 2224/131* (2013.01); *H01L 2224/13111* (2013.01); *H01L 2224/13139* (2013.01); *H01L 2224/13144* (2013.01); *H01L 2224/13147* (2013.01); *H01L 2224/16227* (2013.01); *H01L 2224/1703* (2013.01); *H01L 2224/17181* (2013.01); *H01L 2224/81005* (2013.01); *H01L 2224/81192* (2013.01); *H01L 2224/92* (2013.01); *H01L 2224/97* (2013.01); *H01L 2924/15311* (2013.01)

(58) Field of Classification Search
CPC ............... H01L 23/5226; H01L 23/538; H01L 23/5389; H01L 23/49816; H01L 24/09; H01L 24/17; H01L 24/18; H01L 2224/97; H01L 2224/73204
See application file for complete search history.

(56) References Cited

U.S. PATENT DOCUMENTS

| | | |
|---|---|---|
| 2010/0065954 A1 | 3/2010 | Tu et al. |
| 2010/0072599 A1 | 3/2010 | Camacho et al. |
| 2011/0079917 A1 | 4/2011 | Xia et al. |
| 2011/0159639 A1 | 6/2011 | Yee et al. |
| 2012/0056312 A1* | 3/2012 | Pagaila ................ H01L 21/561 257/684 |
| 2013/0008706 A1 | 1/2013 | Tseng et al. |
| 2014/0021591 A1 | 1/2014 | Sung et al. |
| 2014/0027929 A1 | 1/2014 | Lin et al. |
| 2014/0131858 A1 | 5/2014 | Pan et al. |
| 2014/0225258 A1* | 8/2014 | Chiu ................ H01L 23/49816 257/738 |
| 2014/0264794 A1 | 9/2014 | Woychik et al. |
| 2014/0306341 A1* | 10/2014 | Hou ................ H01L 23/49811 257/737 |
| 2015/0262958 A1* | 9/2015 | Hou ................ H01L 23/49811 257/741 |
| 2015/0348892 A1* | 12/2015 | Kuo ................ H01L 23/49822 174/261 |
| 2016/0056102 A1* | 2/2016 | Konchady ........... H01L 23/5389 174/263 |
| 2016/0358847 A1 | 12/2016 | Shih et al. |
| 2016/0358865 A1 | 12/2016 | Shih et al. |
| 2017/0125332 A1 | 5/2017 | Song et al. |

FOREIGN PATENT DOCUMENTS

| | | |
|---|---|---|
| TW | 201216807 A1 | 4/2012 |
| TW | 201430967 A | 9/2014 |

OTHER PUBLICATIONS

Chinese Office Action from Chinese Application No. 201510607208.4, dated Dec. 18, 2018, 16 pages.
Chinese Office Action from Chinese Application No. 201510607208.4, dated Apr. 19, 2019, 23 pages.

* cited by examiner

MICROELECTRONIC PACKAGE STRUCTURES INCLUDING REDISTRIBUTION LAYERS

CROSS-REFERENCE TO RELATED APPLICATION

This application is a divisional of U.S. patent application Ser. No. 14/731,380, filed Jun. 4, 2015, now U.S. Pat. No. 9,916,999, issued Mar. 13, 2018, the disclosure of which is hereby incorporated herein in its entirety by this reference.

BACKGROUND

Description of Related Art

With the evolution in the manufacturing technology of semiconductor devices, the functional density of the semiconductor devices has increased with the decrease of device sizes to achieve higher integration density of the semiconductor devices. As a result, demands to the packaging technology are becoming severe under conditions of decreased size and increased density of the semiconductor devices. Recently, the demands to the smaller electronic devices have increased, and innovative packaging technology is required.

Currently, through vias have been developed in an interposer substrate layer of an interposer with additional metallization layers built on top of the interposer substrate layer to improve the density of the semiconductor devices. However, forming the interposer substrate layer with the through vias is a complex process.

Accordingly, an improved package structure and a manufacturing method thereof are required.

SUMMARY

The present disclosure provides a package structure. The package structure includes a substrate, a first connector, a redistribution layer, a second connector, and a chip. The first connector is disposed over the substrate. The redistribution layer is directly disposed over the first connector, and is connected to the substrate by the first connector. The redistribution layer includes a block layer, and a metal layer over the block layer. The second connector is directly disposed over the redistribution layer, and the chip is connected to the redistribution layer by the second connector.

In various embodiments of the present disclosure, the metal layer includes a dielectric layer and a plurality of metal segments. The metal segments are disposed in the dielectric layer.

In various embodiments of the present disclosure, the first connector interposes the block layer, and connects to the metal layer.

In various embodiments of the present disclosure, the block layer is made of silicon carbide, silicon nitride, or a combination thereof.

In various embodiments of the present disclosure, the package structure includes a plurality of redistribution layers.

In various embodiments of the present disclosure, the metal layers are horizontally aligned, and the different metal layers are connected by a plurality of vias, which penetrate the block layers therebetween.

In various embodiments of the present disclosure, the first connector interposes the bottommost layer of the block layers, and connects the bottommost layer of the metal layers and the substrate.

In various embodiments of the present disclosure, the first connector and the second connector are independently a solder bump or a solder ball.

In various embodiments of the present disclosure, the package structure further includes a passivation layer between the substrate and the redistribution layer, and interposed by the first connector.

In various embodiments of the present disclosure, the passivation layer is made of silicon oxide, silicon nitride, benzocyclobutene (BCB), polyimide (PI), polybenzoxazole (PBO), or a combination thereof.

The present disclosure provides a method for manufacturing a package structure, and the method includes following steps. A redistribution layer is formed, including forming a metal layer and forming a block layer over the metal layer. A first connector is formed directly on a first side of the redistribution layer. A second connector is formed directly on a second side opposite to the first side of the redistribution layer. The second side of the redistribution layer is connected to a chip by the second connector. The first side of the redistribution layer is connected to a substrate by the first connector.

In various embodiments of the present disclosure, the redistribution layer is formed over a first carrier.

In various embodiments of the present disclosure, the method further includes connecting the first side of the redistribution layer to a second carrier by the first connector. Then, the first carrier is removed before forming the second connector.

In various embodiments of the present disclosure, the method further includes removing the second carrier after bonding the second side of the redistribution layer to the chip.

In various embodiments of the present disclosure, the method further includes forming a temporary adhesive over the chip before removing the second carrier. Then, the temporary adhesive is removed after bonding the first side of the redistribution layer to the substrate.

In various embodiments of the present disclosure, forming the metal layer is performed by a damascene process.

In various embodiments of the present disclosure, forming the metal layer includes depositing a dielectric layer. Next, the dielectric layer is etched to form a plurality of openings. Then, the openings are filled with a metal material to form a plurality of metal segments.

In various embodiments of the present disclosure, forming the first connector includes the first connector and interposing the block layer and connecting to the metal layer.

In various embodiments of the present disclosure, the method includes forming a plurality of redistribution layers.

In various embodiments of the present disclosure, the method further includes forming a passivation layer over the redistribution layer, and interposed by the first connector.

These and other features, aspects, and advantages of the present disclosure will become better understood with reference to the following detailed description and appended claims.

It is to be understood that both the foregoing general description and the following detailed description are by examples, and are intended to provide further explanation of the invention as claimed.

BRIEF DESCRIPTION OF THE DRAWINGS

The disclosure could be more fully understood by reading the following detailed description of the embodiment, with reference made to the accompanying drawings as follows.

DETAILED DESCRIPTION

Figure 1A:
FIGS. 1A through 1L are cross-sectional views at various stages of fabricating a package structure in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying drawings for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As aforementioned problems, fabricating an interposer including an interposer substrate layer with through-silicon-vias (TSVs) and additional metallization layers built on top of the interposer substrate layer is a complex process. The reason is that there are several fabrication steps required to form the interposer substrate layer with the TSVs, which includes forming TSVs within the interposer substrate layer, and performing backside thinning and chemical vapor deposition (CVD) or chemical-mechanical planarization (CMP). These fabrication steps increase the difficulty of wafer-handling. The process for fabricating the interposer substrate layer with the TSVs is complicated and costly.

The present disclosure provides a package structure and a fabricating method thereof. The fabricating method of the present disclosure eliminates the TSV module, and skips the grinding process for the silicon substrate. Therefore, the method provided by the present disclosure has a simpler process flow and a lower process cost.

Reference will now be made to FIGS. 1A through 1L, which are cross-sectional views at various stages of fabricating a package structure 100 (FIG. 1L) in accordance with various embodiments of the present disclosure.

As shown in FIG. 1A, a first passivation layer 112 is formed over a first carrier 202. The first carrier 202 may be made of silicon or glass. When the first carrier 202 is made of silicon, the first passivation layer 112 is formed by directly depositing over the first carrier 202. When the first carrier 202 is made of glass, the first passivation layer 112 may be formed by directly depositing over the first carrier 202, or may be formed after forming a release layer. In embodiments, the first passivation layer 112 is made of silicon oxide ($SiO_2$), silicon nitride (SiN), benzocyclobutene (BCB), polyimide (PI), polybenzoxazole (PBO), or a combination thereof.

Next, a redistribution layer is formed. The redistribution layer includes a metal layer and a block layer, and the metal layer includes a dielectric layer and metal segments disposed in the dielectric layer. The metal layer may be formed by a damascene process, such as a single-damascene process and a dual-damascene process. The dielectric layer and the metal segments of the metal layer formed by a damascene process are coplanar. In embodiments, a metal layer 120 is formed by the process shown in the following FIGS. 1B through 1D.

Figure 1B:
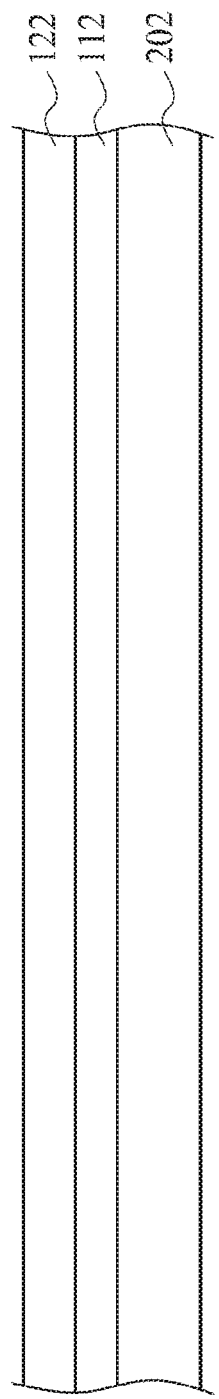

FIG. 1B shows that a dielectric layer 122 is deposited over the first passivation layer 112. In embodiments, the dielectric layer 122 is made of silicon oxide ($SiO_2$), silicon nitride ($Si_3N_4$), or a combination thereof. The dielectric layer 122 may be formed by any suitable deposition process. Examples of the deposition include, but are not limited to, chemical vapor deposition (CVD), physical vapor deposition (PVD), atomic layer deposition (ALD), and a combination thereof.

Figure 1C:
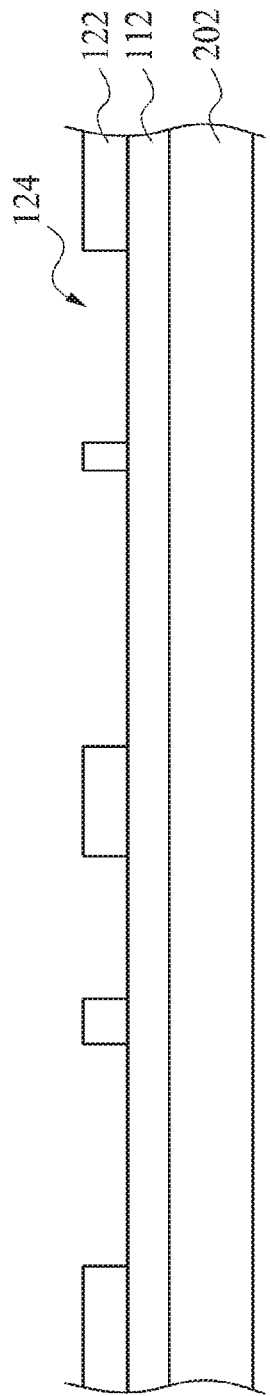

Continuing in FIG. 1C, the dielectric layer 122 is etched to form a plurality of openings 124. In embodiments, the openings are lines, vias, holes, or trenches. The etching may be dry etching or wet etching.

Figure 1D:
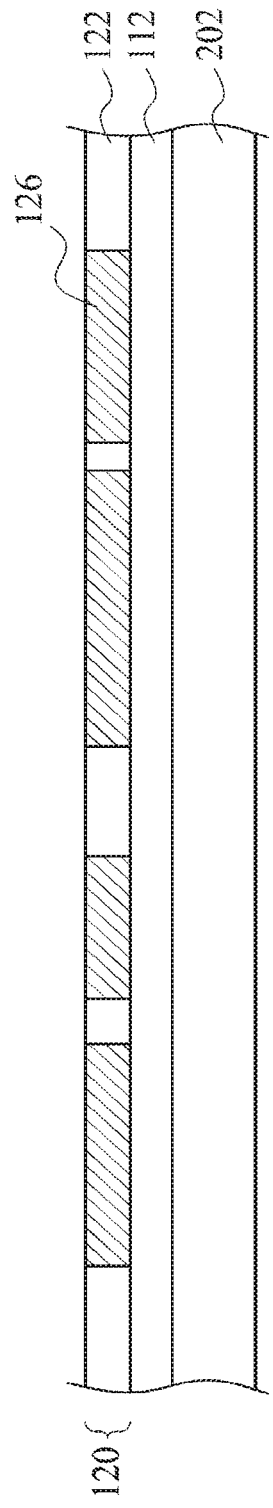

Continuing in FIG. 1D, the openings 124 are filled with a metal material to form a plurality of metal segments 126. In embodiments, the metal segments 126 are formed by deposition. In embodiments, the metal segments 126 are made of copper (Cu), aluminum (Al), or a combination thereof. A barrier layer may be formed on the sidewalls of the openings 124 before filling the metal material. A chemical-mechanical planarization (CMP) process may be performed after filling the openings 124 with the metal material to level the metal segments 126 with the dielectric layer 122. The metal layer 120 is thereby formed.

Figure 1E:
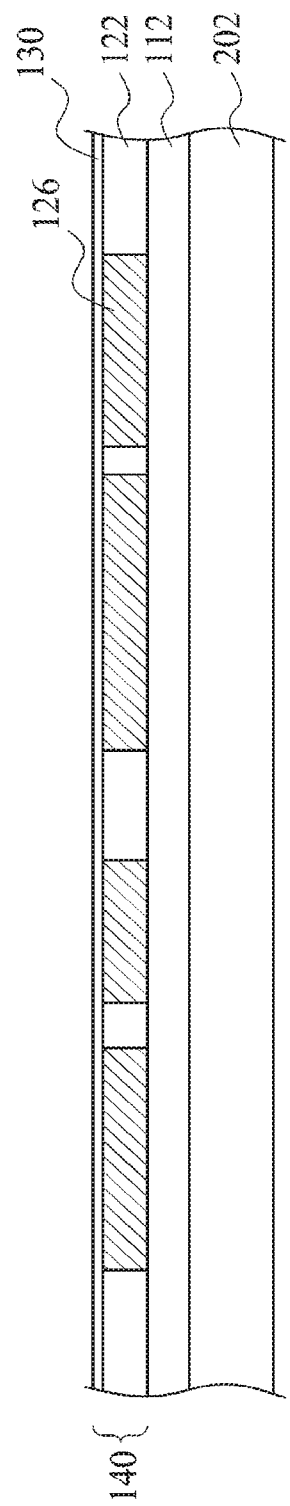

Referring to FIG. 1E, a block layer 130 is formed over the metal layer 120 (FIG. 1D). The redistribution layer 140 is thereby formed. The block layer 130 may be formed by deposition, such as CVD, PVD, ALD, or other suitable process. In embodiments, the block layer 130 is made of silicon carbide (SiC), silicon nitride (SiN), or a combination thereof.

Figure 1F:
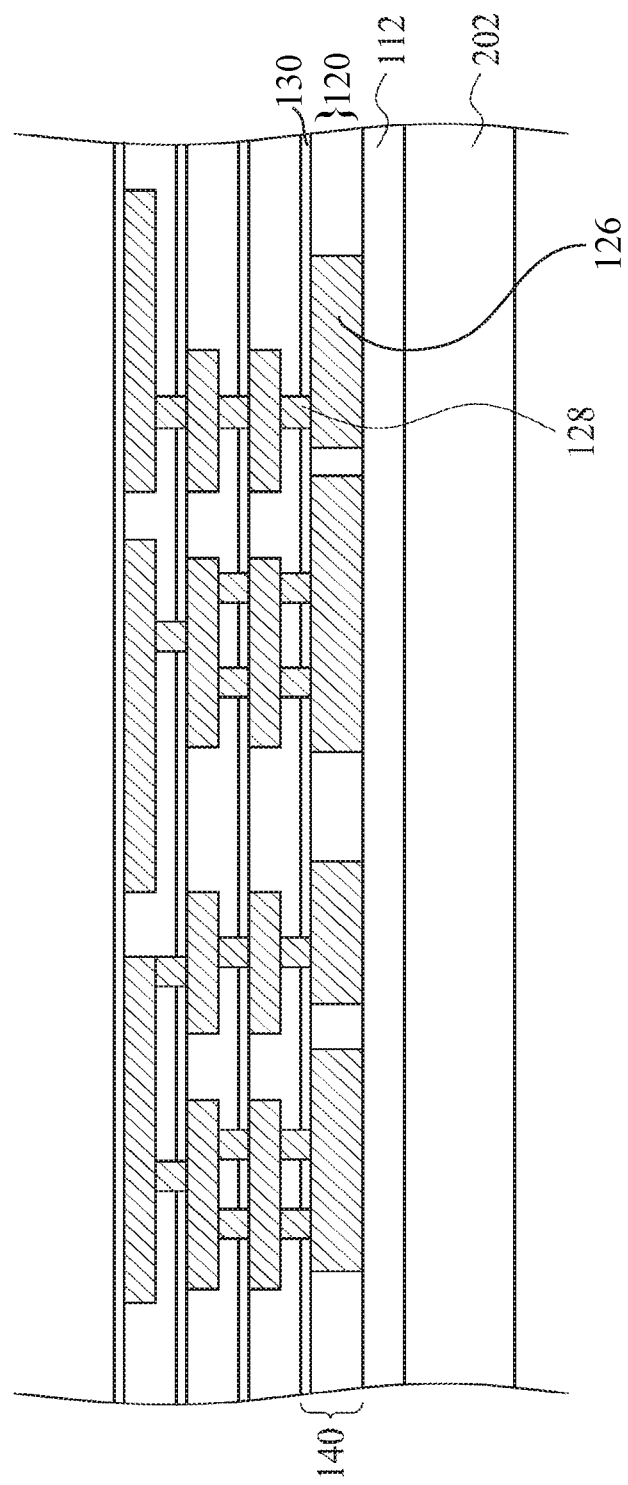

FIGS. 1B through 1E show a process of forming one redistribution layer 140 in accordance with various embodiments of the present disclosure. The package structure 100 may include a plurality of redistribution layers 140 depending on the requirement of the product. FIG. 1F shows the formed structure with four redistribution layers 140. It is noteworthy that the block layers 130 between the metal layers 120 are not continuous, and are penetrated by a plurality of vias 128. The vias 128 connect the metal segments 126 of different metal layers 120. In embodiments, the metal layer 120 is formed by a single-damascene process or a dual-damascene process, and portions of the block layers 130 are removed during this process. The vias 128 may be formed along with the metal segments 126. For instance, a first metal layer including a first dielectric layer and first metal segments is formed. Next, a first block layer is formed over the first metal layer. Then, a second metal layer is formed by a damascene process, which starts with forming a second dielectric layer over the first block layer. The process continues with removing portions of the second dielectric layer as well as the first block layer to form openings. Next, a metal material is filled into the openings to form second metal segments as well as vias penetrating the first block layer. Then, a second block layer is formed over the second metal layer. The above steps may be repeated until reaching the required layers of the redistribution layer.

Figure 1G:
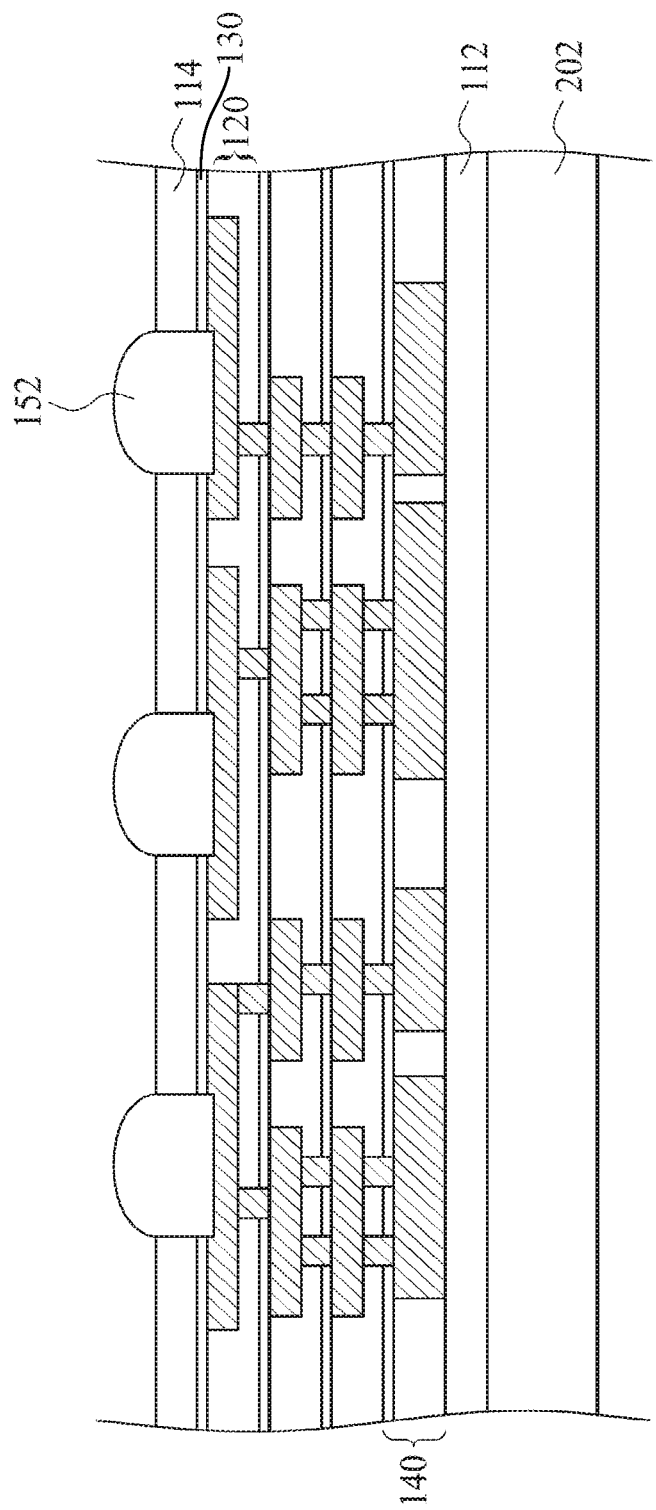

Continuing in FIG. 1G, after forming the redistribution layers 140, a second passivation layer 114 is formed over the topmost redistribution layer 140. Further, portions of the second passivation layer 114 and the topmost block layer 130 are removed to expose portions of the topmost metal layer 120. Then, a plurality of first connectors 152 is formed directly over the exposed portions of the topmost metal layer 120. That is, the second passivation layer 114 and the topmost block layer 130 are interposed by the first connectors 152. Examples of the material of the second passivation layer 114 may refer to counterparts of the first passivation layer 112, and are not repeated herein. In embodiments, the first connectors 152 are solder bumps or solder balls. Material of the first connectors 152 may be silver, copper, or tin-based compositions. The first connectors 152 may be formed using electroplating or electroless plating techniques, or using screening or jet printing techniques. The first connectors 152 also may be other types of connectors, such as copper or gold pillars, conductive studs, or C4 (controlled collapse chip connection) bumps.

It is noteworthy that the "topmost" metal layer 120 or block layer 130 indicated herein represents the relative position of the metal layer 120 or block layer 130 to the first carrier 202. That is, the "topmost" metal layer 120 or block layer 130 is at the top when the first carrier 202 is at the bottom, and is the farthest metal layer 120 or block layer 130 from the first carrier 202.

In embodiments, forming the first connector includes forming an under-bump metallization (UBM) layer over the exposed portion of the topmost metal layer, and forming a first connector body over the UBM layer. The UBM layer may be U-shaped, and may cover portions of the second passivation layer 114. Examples of the material of the UBM layer include, but are not limited to, TiN, Ti, Sn, Ag, Cu, Au, Ni, alloys thereof, and a combination thereof.

Figure 1H:
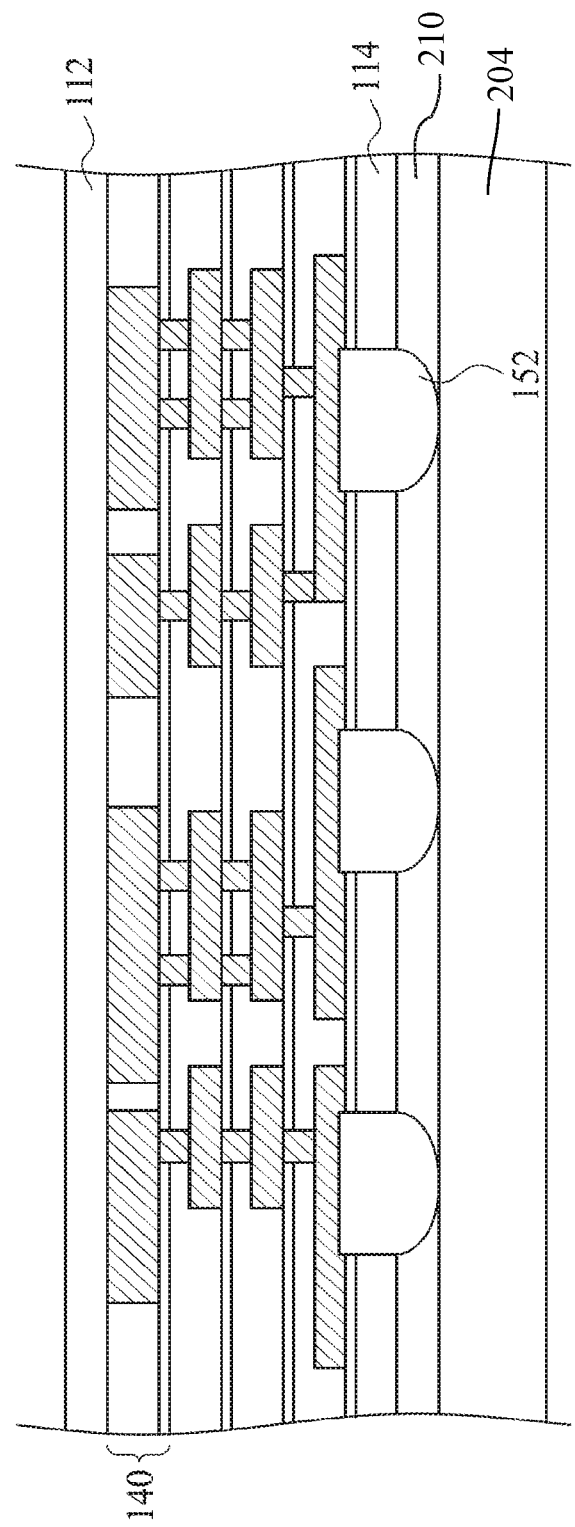

Referring to FIG. 1H, the structure shown in FIG. 1G is bonded to a second carrier 204 by the first connectors 152 and an adhesion layer 210. The adhesion layer 210 is formed over the second passivation layer 114 before bonding to the second carrier 204.

Still referring to FIG. 1H, the first carrier 202 is removed from the first passivation layer 112. The first passivation layer 112 is thereby exposed. As stated above, the first carrier 202 may be made of silicon or glass. When the first carrier 202 is made of silicon, the first carrier may be removed by grinding and wet etching. When the first carrier is made of glass, the first carrier may be removed by laser debonding.

After the bonding of the second carrier 204 and the debonding of the first carrier 202, FIG. 1H shows the structure with the second carrier 204 as the bottommost component. The following FIGS. 1H through 1L are inverted relative to FIGS. 1A through 1G.

Figure 1I:
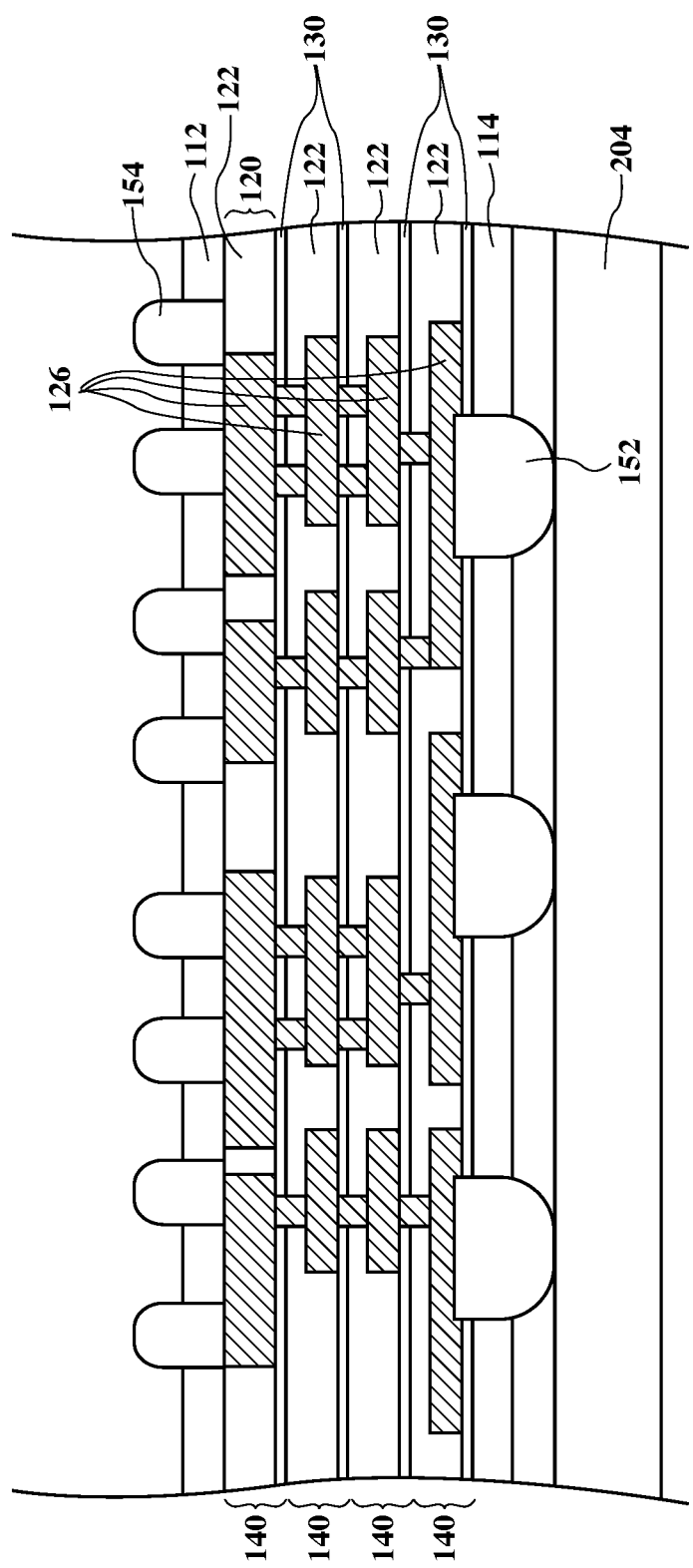

Continuing in FIG. 1I, portions of the first passivation layer 112 are removed to form a plurality of second connectors 154 directly over the topmost metal layer 120. The second connectors 154 are connected to the metal segments 126 of the topmost metal layer 120. Examples of the material of the second connectors 154 may refer to counterparts of the first connectors 152, and are not repeated herein.

It is noteworthy that the "topmost" metal layer 120 indicated herein represents the relative position of the metal layer 120 to the second carrier 204. That is, the "topmost" metal layer 120 is at the top when the second carrier 204 is at the bottom, and is the farthest metal layer 120 from the second carrier 204. Further, FIG. 1I is inverted relative to FIG. 1G. Hence, the "topmost metal layer 120" referred herein is different from the "topmost metal layer 120" discussed above in accordance with FIG. 1G.

Figure 1J:
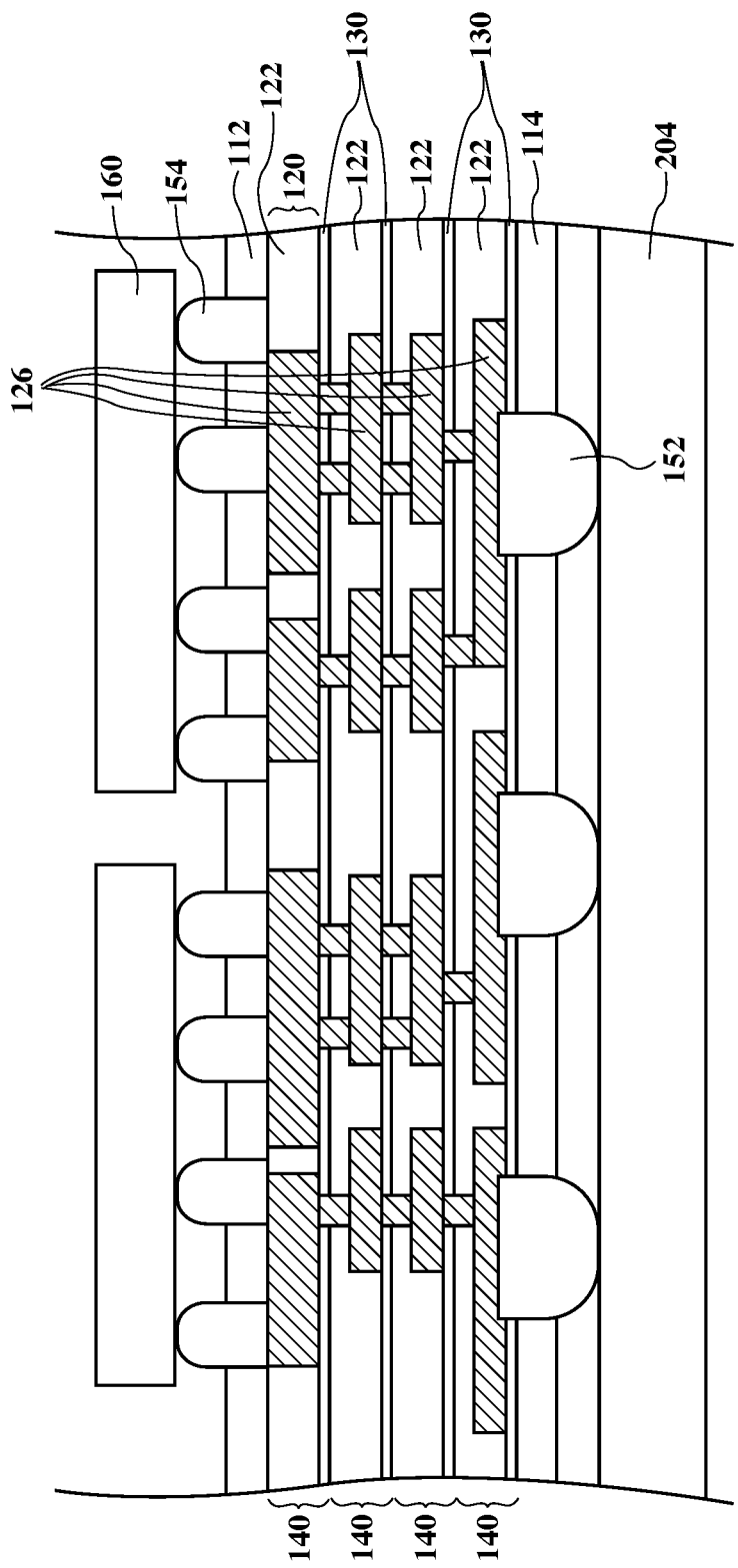

Referring to FIG. 1J, chips 160 are mounted over the second connectors 154. The chips 160 are connected to the redistribution layer 140 by the second connectors 154. Particularly, the chips 160 are connected to the topmost metal layer 120 by the second connectors 154. Still, the "topmost metal layer 120" indicated herein represents the relative position of the metal layer 120 to the second carrier 204. The chips 160 may be the same or different types of chips.

Figure 1K:
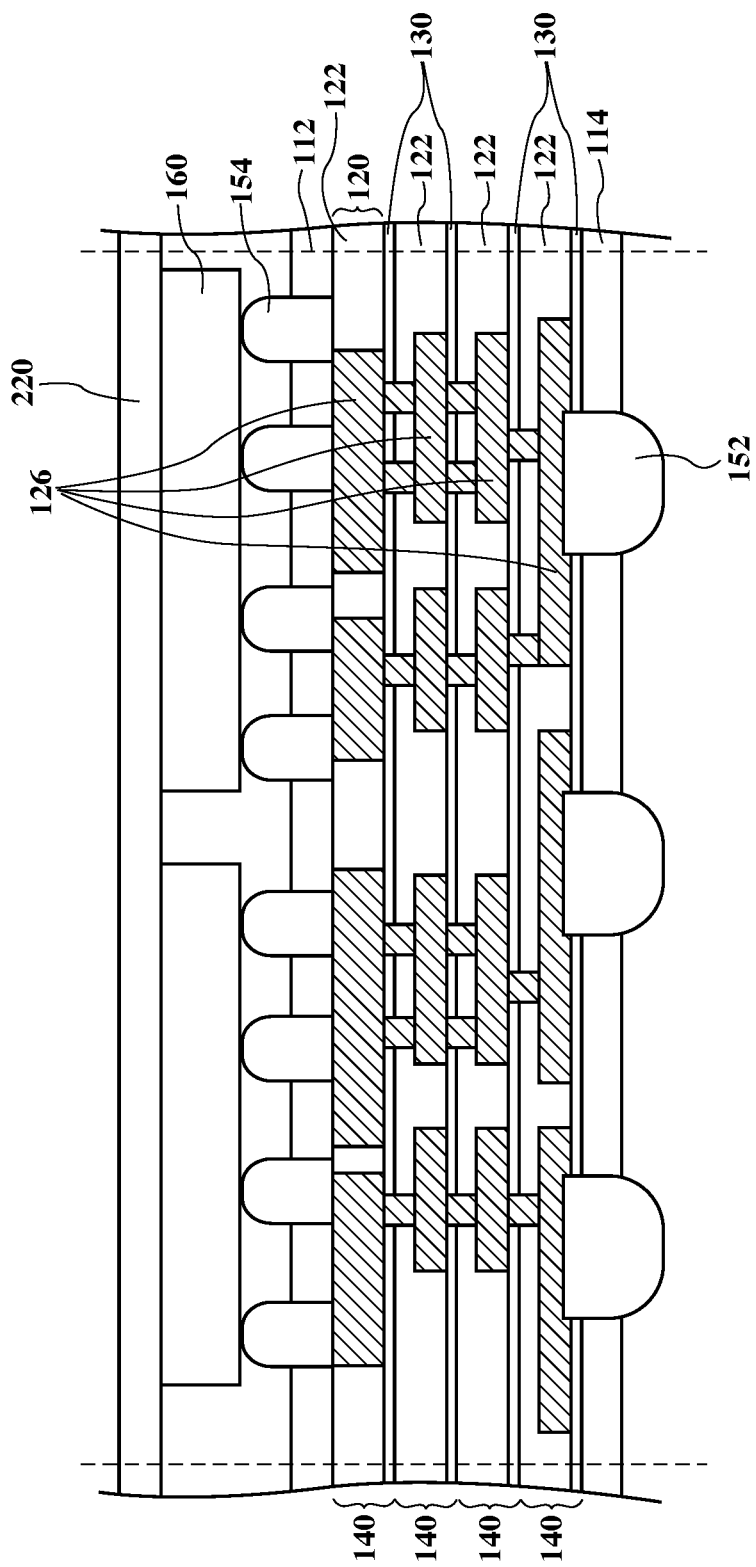

Continuing in FIG. 1K, a temporary adhesive 220 is formed over the chips 160. The temporary adhesive 220 is used to connect the chips 160, and sustains the structure for the subsequent process of removing the second carrier 204. The temporary adhesive 220 may be a dicing tape. Then, the second carrier 204 and the adhesion layer 210 are removed. The second carrier 204 may be removed by any suitable methods, such as temporary bonding/debonding (TB/DB) technology. For instance, the second carrier 204 is removed by mechanical debonding or laser debonding.

Figure 1L:
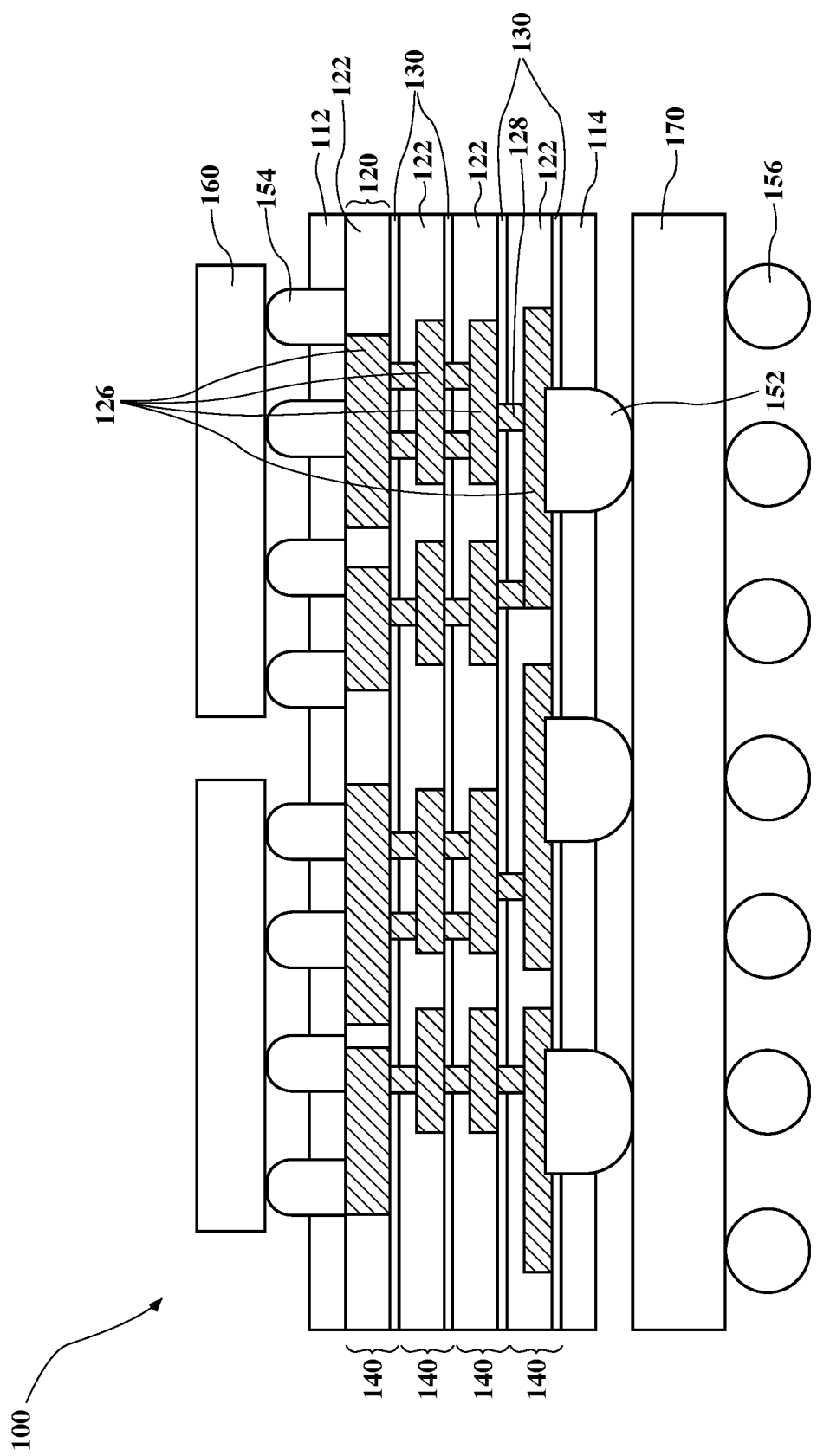

Referring to FIG. 1L, a dicing process is performed to the structure shown in FIG. 1K along the dotted lines to separate the chips 160. Then, the diced structure is mounted on a substrate 170 to form the package structure 100 shown in FIG. 1L. The substrate 170 is connected to the redistribution layer 140 by the first connectors 152. Particularly, the substrate 170 is connected to the bottommost layer of the metal layers 120 by the first connectors 152. The package structure 100 is thereby formed. The substrate may be a board, such as a printed circuit board (PCB).

It is noteworthy that the "bottommost" metal layer 120 indicated herein represents the relative position of the metal layer 120 to the substrate 170. That is, the "bottommost" metal layer 120 is the nearest metal layer 120 to the substrate 170 when the substrate 170 is at the bottom. Further, FIG. 1L is inverted relative to FIG. 1G. Hence, the "bottommost metal layer 120" referred herein is the same as the "topmost metal layer 120" discussed above in accordance with FIG. 1G.

In embodiments, the package structure further includes third connectors 156 under the substrate 170. Examples of material of the third connectors 156 may refer to counterparts of the first connectors 152, and are not repeated herein.

The method for fabricating the package structure of the present disclosure is TSV-less and silicon-substrate-less, which means that the method of the present disclosure eliminates the process of forming an interposer substrate layer with TSVs. The redistribution layer in the package structure is formed to directly connect to the substrate and the chip. The formed package structure includes the block layer adjacent to the metal layer. Therefore, the method for fabricating the package structure of the present disclosure includes a simpler process flow by eliminating the TSV module and skipping silicon grinding process, and thereby having a lower process cost.

The package structure 100 fabricated by the process shown in FIGS. 1A through 1L includes a substrate 170, first connector 152, second connectors 154, third connectors 156, redistribution layers 140, a first passivation layer 112, a second passivation layer 114, and chips 160. The substrate 170 is disposed over the third connectors 156. The first connectors 152 are disposed over the substrate 170. The second passivation layer 114 is disposed under the bottommost redistribution layer 140, and is interposed by the first connectors 152. The redistribution layers 140 are directly disposed over the first connectors 152, and the bottommost redistribution layer 140 is connected to the substrate 170 by the first connector 152. Each of the redistribution layers 140 includes a block layer 130 and a metal layer 120 over the block layer 130. Each of the metal layers 120 includes a dielectric layer 122 and metal segments 126 disposed in the dielectric layer 122. The metal layers 120 are horizontally aligned, and the different metal layers 120 are connected by vias 128, which penetrate the block layers 130 between the different metal layers 120. The first passivation layer 112 is disposed over the topmost redistribution layer 140, and is spaced for the second connectors 154 connecting the redistribution layer 140 and the chips 160. The second connectors 154 are directly disposed over the topmost redistribution layer 140, and the chips 160 are connected to the redistribution layer 140 by the second connectors 154.

Particularly, the first connectors 152 interpose the bottommost layer of the block layers 130, and connect the bottommost layer of the metal layers 120 and the substrate 170.

As stated above, the "topmost" and the "bottommost" represent the relative positions to the substrate 170. That is, when the substrate 170 is at the bottom, the "topmost" indicates the farthest layer from the substrate 170, while the "bottommost" indicates the nearest layer to the substrate 170.

The package structure of the present disclosure is TSV-less and silicon-substrate-less. The redistribution layer in the package structure is directly connected to the substrate and the chip, and provides electrical interconnections. The package structure of the present disclosure can be formed by a simpler and less costly process.

The embodiments of the present disclosure discussed above have advantages over existing package structures and processes, and the advantages are summarized below. The process for fabricating the interposer substrate layer with TSVs is complicated and costly. Instead, the present disclosure applies the redistribution layer to the package structure, which is directly connected to the substrate and the chip. The redistribution layer includes the block layer adjacent to the metal layer. Further, the metal segments in the metal layer may be formatted by a single-damascene or dual-damascene process, so the dielectric layer and the metal segments of the formed metal layer are coplanar. The present disclosure provides a simpler process flow and a lower process cost for fabricating a package structure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A microelectronic package structure, comprising:
a substrate;
first connectors located over the substrate;
redistribution layers located directly over the first connectors, and a first side of the redistribution layers connected to the substrate using the first connectors, each of the redistribution layers comprising:
a block material;
a dielectric material over the block material; and
metal segments located within openings of the dielectric material;
a first passivation material located between the substrate and the first side of the redistribution layers, the first connectors extending through openings in the first passivation material and through openings in the block material of the redistribution layer nearest the substrate;
second connectors located directly over a second side of the redistribution layers opposite the first side of the redistribution layers, the second connectors extending through openings in a second passivation material located on the second side of the redistribution layers, and the second passivation material located directly on the dielectric material of the redistribution layer nearest the second connectors, wherein the dielectric material and the metal segments of the redistribution layer nearest the second connectors are coplanar; and
at least one die connected to the metal segments of the redistribution layer nearest the second connectors on the second side of the redistribution layers using the second connectors, each of the second connectors comprising a single element in direct contact with the at least one die and the metal segments of the redistribution layer nearest the second connectors, wherein the at least one die is electrically connected to the substrate only through the redistribution layers.

2. The microelectronic package structure of claim 1, wherein the first connectors connect to the metal segments of the redistribution layer nearest the substrate on the first side of the redistribution layers.

3. The microelectronic package structure of claim 1, wherein the block material comprises silicon carbide, silicon nitride, or a combination thereof.

4. The microelectronic package structure of claim 1, wherein the metal segments are horizontally aligned, and different layers of the metal segments are connected by vias penetrating the block material therebetween.

5. The microelectronic package structure of claim 1, wherein the first connectors extend through a bottommost layer of the block material and connect a bottommost layer of the metal segments and the substrate.

6. The microelectronic package structure of claim 1, wherein the first connectors and the second connectors comprise a solder bump or a solder ball.

7. The microelectronic package structure of claim 1, wherein each of the first passivation material and the second passivation material comprises silicon oxide, silicon nitride, benzocyclobutene, polyimide, polybenzoxazole, or a combination thereof.

8. A microelectronic device package, comprising:
a substrate;
at least one die electrically connected to the substrate;
redistribution layers providing direct electrical connection between the at least one die and the substrate, the at least one die being electrically connected to the substrate only through the redistribution layers, each of the redistribution layers comprising:
a block material;
a dielectric material located on the block material; and
metal segments located within openings of the dielectric material;
first interconnect structures located between the substrate and the redistribution layers;
second interconnect structures located between the at least one die and the redistribution layers, each of the second interconnect structures comprising a single element in direct contact with the at least one die and the metal segments of the redistribution layer nearest the at least one die;
a first passivation material located between the substrate and the block material of the redistribution layer nearest the substrate, the first interconnect structures extending through openings in the first passivation material and through openings in the block material of the redistribution layer nearest the substrate; and
a second passivation material located between the at least one die and the dielectric material of the redistribution layer nearest the at least one die, the second passivation material located directly on the dielectric material of the redistribution layer nearest the at least one die, and the second interconnect structures extending through openings in the second passivation material, wherein the dielectric material and the metal segments of the redistribution layer nearest the at least one die are coplanar.

9. The microelectronic device package of claim 8, wherein:
the redistribution layers are in contact with the substrate through the first interconnect structures located between the substrate and the metal segments of the redistribution layer nearest the substrate; and
the redistribution layers are in contact with the at least one die through the second interconnect structures located between the at least one die and the metal segments of a of the redistribution layer nearest the at least one die.

10. The microelectronic device package of claim 8, wherein:
the first interconnect structures are in direct physical contact with the metal segments of the redistribution layer nearest the substrate; and
the second interconnect structures are in direct physical contact with the metal segments of the redistribution layer nearest the at least one die.

11. The microelectronic device package of claim 8, further comprising third interconnect structures located on a side of the substrate opposite the first interconnect structures.

12. The microelectronic device package of claim 8, further comprising vias connecting the metal segments of separate redistribution layers, the vias extending through openings within intervening block material.

13. The microelectronic device package of claim 8, further comprising a barrier material between sidewalls of the dielectric material and the metal segments located within the openings of the dielectric material.

14. The microelectronic device package of claim 8, wherein the openings of the dielectric material comprise at least one of lines, vias, holes, or trenches.

15. The microelectronic device package of claim 8, wherein the substrate is a silicon-less substrate comprising a printed circuit board.

* * * * *

UNITED STATES PATENT AND TRADEMARK OFFICE
CERTIFICATE OF CORRECTION

PATENT NO. : 10,566,229 B2
APPLICATION NO. : 15/910360
DATED : February 18, 2020
INVENTOR(S) : Shing-Yih Shih, Hsu Chiang and Neng-Tai Shih It is certified that error appears in the above-identified patent and that said Letters Patent is hereby corrected as shown below:

In the Claims

Claim 9, Column 9, Line 17, change "a of the redistribution" to --the redistribution--

Signed and Sealed this
Thirty-first Day of March, 2020

Andrei Iancu
*Director of the United States Patent and Trademark Office*